(12) United States Patent
Shinada et al.

(10) Patent No.: US 11,512,388 B2
(45) Date of Patent: Nov. 29, 2022

(54) FILM FORMING APPARATUS AND FILM FORMING METHOD

(71) Applicant: TOKYO ELECTRON LIMITED, Tokyo (JP)

(72) Inventors: Masato Shinada, Tokyo (JP); Hiroyuki Toshima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 152 days.

(21) Appl. No.: 16/534,116

(22) Filed: Aug. 7, 2019

(65) Prior Publication Data
US 2020/0048759 A1   Feb. 13, 2020

(30) Foreign Application Priority Data

Aug. 10, 2018 (JP) .............................. JP2018-151674

(51) Int. Cl.
*C23C 14/34* (2006.01)
*H01L 21/67* (2006.01)
(Continued)

(52) U.S. Cl.
CPC ........ *C23C 14/345* (2013.01); *H01J 37/3402* (2013.01); *H01L 21/02266* (2013.01); *H01L 21/67069* (2013.01)

(58) Field of Classification Search
CPC ... C23C 14/345; C23C 14/04; C23C 14/5873; C23C 14/226; C23C 14/34;
(Continued)

(56) References Cited

U.S. PATENT DOCUMENTS 5,922,179 A * 7/1999 Mitro .................... C23C 14/566
204/298.04
10,392,688 B2   8/2019 Takei et al.
(Continued)

FOREIGN PATENT DOCUMENTS

JP   S59-19325 A   1/1984
JP   06-093426 A   4/1994
(Continued)

OTHER PUBLICATIONS

JP-2002208531-A Translation (Year: 2002).*

*Primary Examiner* — Jennifer Wecker
*Assistant Examiner* — Patrick S Ott
(74) *Attorney, Agent, or Firm* — Nath, Goldberg & Meyer; Jerald L. Meyer; Tanya E. Harkins

(57) ABSTRACT

There is provided a film forming apparatus, including: a processing chamber having a processing space in which a film forming process is performed on a substrate; a substrate support part configured to support the substrate inside the processing chamber; at least one sputtering particle emission part including a target and configured to emit sputtering particles to the substrate from the target; and at least one etching particle emission part configured to emit etching particles having an etching action with respect to the substrate, wherein the sputtering particles emitted from the at least one sputtering particle emission part are deposited on the substrate to form a film, and a portion of the film is etched by the etching particles emitted from the at least one etching particle emission part.

7 Claims, 13 Drawing Sheets

(51) Int. Cl.
*H01J 37/34* (2006.01)
*H01L 21/02* (2006.01)

(58) Field of Classification Search
CPC ......... H01L 21/67069; H01L 21/02266; H01L 21/68785; H01L 21/6719; H01L 21/68764; H01L 21/67742; H01J 37/3402
See application file for complete search history.

(56) References Cited

U.S. PATENT DOCUMENTS

| | | |
|---|---|---|
| 2006/0054494 A1 | 3/2006 | Reiss |
| 2013/0206583 A1* | 8/2013 | Roque ................ H01J 37/3053 204/192.11 |
| 2013/0299345 A1* | 11/2013 | Abarra ............... H01J 37/3435 204/298.11 |
| 2014/0014497 A1* | 1/2014 | Druz ....................... C23C 14/14 204/192.11 |
| 2016/0247932 A1* | 8/2016 | Sakai ................ H01L 29/40111 |
| 2017/0025603 A1* | 1/2017 | Hara ....................... H01L 43/02 |
| 2020/0027707 A1* | 1/2020 | Hatem ................... C23C 14/34 |
| 2020/0043711 A1 | 2/2020 | Toshima et al. |
| 2020/0048759 A1 | 2/2020 | Shinada et al. |
| 2020/0051796 A1 | 2/2020 | Shinada et al. |

FOREIGN PATENT DOCUMENTS

| | | | | |
|---|---|---|---|---|
| JP | 2000-129436 A | 5/2000 | | |
| JP | 2002-208531 A | 7/2002 | | |
| JP | 2002208531 A * | 7/2002 | ............. | H01F 41/34 |
| JP | 2005-256032 A | 9/2005 | | |
| JP | 4473343 B | 6/2010 | | |
| JP | 2010-539674 A | 12/2010 | | |
| JP | 2013-253316 A | 12/2013 | | |
| JP | 201567856 A | 4/2015 | | |
| JP | 2016-033266 A | 3/2016 | | |
| KR | 1020010051306 A | 6/2001 | | |
| WO | 2011058812 A1 | 5/2011 | | |
| WO | 2013179575 A1 | 12/2013 | | |

* cited by examiner

FILM FORMING APPARATUS AND FILM FORMING METHOD

CROSS-REFERENCE TO RELATED APPLICATION

This application is based upon and claims the benefit of priority from Japanese Patent Application No. 2018-151674, filed on Aug. 10, 2018, the entire contents of which are incorporated herein by reference.

TECHNICAL FIELD

The present disclosure relates to a film forming apparatus and a film forming method.

BACKGROUND

In the manufacture of an electronic device such as a semiconductor device or the like, a film forming process is performed to form a film on a substrate. A sputtering apparatus as disclosed in Patent Document 1 is known as one of a film forming apparatus used for such a film forming process.

The sputtering apparatus disclosed in Patent Document 1 includes a vacuum container, a stage provided inside the vacuum container and on which a substrate is mounted, and a target. The target is provided above the stage. In this film forming apparatus, a film is formed by depositing sputtering particles emitted from the target on the substrate while rotating the stage.

On the other hand, in Patent Document 2, a sputtering apparatus in which sputtering particles are obliquely incident on a substrate has been proposed as a technique for realizing film formation with high directivity in which the incidence direction of the sputtering particles is aligned with a pattern of the substrate.

The sputtering apparatus disclosed in Patent Document 2 includes a vacuum container, a substrate holding table provided inside the vacuum container, a target holder for holding a target, and an shielding assembly provided between the target holder and the substrate holding table and having an opening (passage hole). While moving the substrate holding table by a moving mechanism, sputtering particles emitted from the target are allowed to pass through the opening of the shielding assembly and are caused to be incident on the substrate at a predetermined angle.

PRIOR ART DOCUMENT

Patent Documents

Patent Document 1: International Publication No. 2013/179575

Patent Document 2: Japanese Patent Laid-Open Publication No. 2015-67856

SUMMARY

According to one embodiment of the present disclosure, there is provided a film forming apparatus, including: a processing chamber having a processing space in which a film forming process is performed on a substrate; a substrate support part configured to support the substrate inside the processing chamber; at least one sputtering particle emission part including a target and configured to emit sputtering particles to the substrate from the target; and at least one etching particle emission part configured to emit etching particles having an etching action with respect to the substrate, wherein the sputtering particles emitted from the at least one sputtering particle emission part are deposited on the substrate to form a film, and a portion of the film is etched by the etching particles emitted from the at least one etching particle emission part.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Embodiments will be specifically described below with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

First, a first embodiment will be described.

Figure 1:
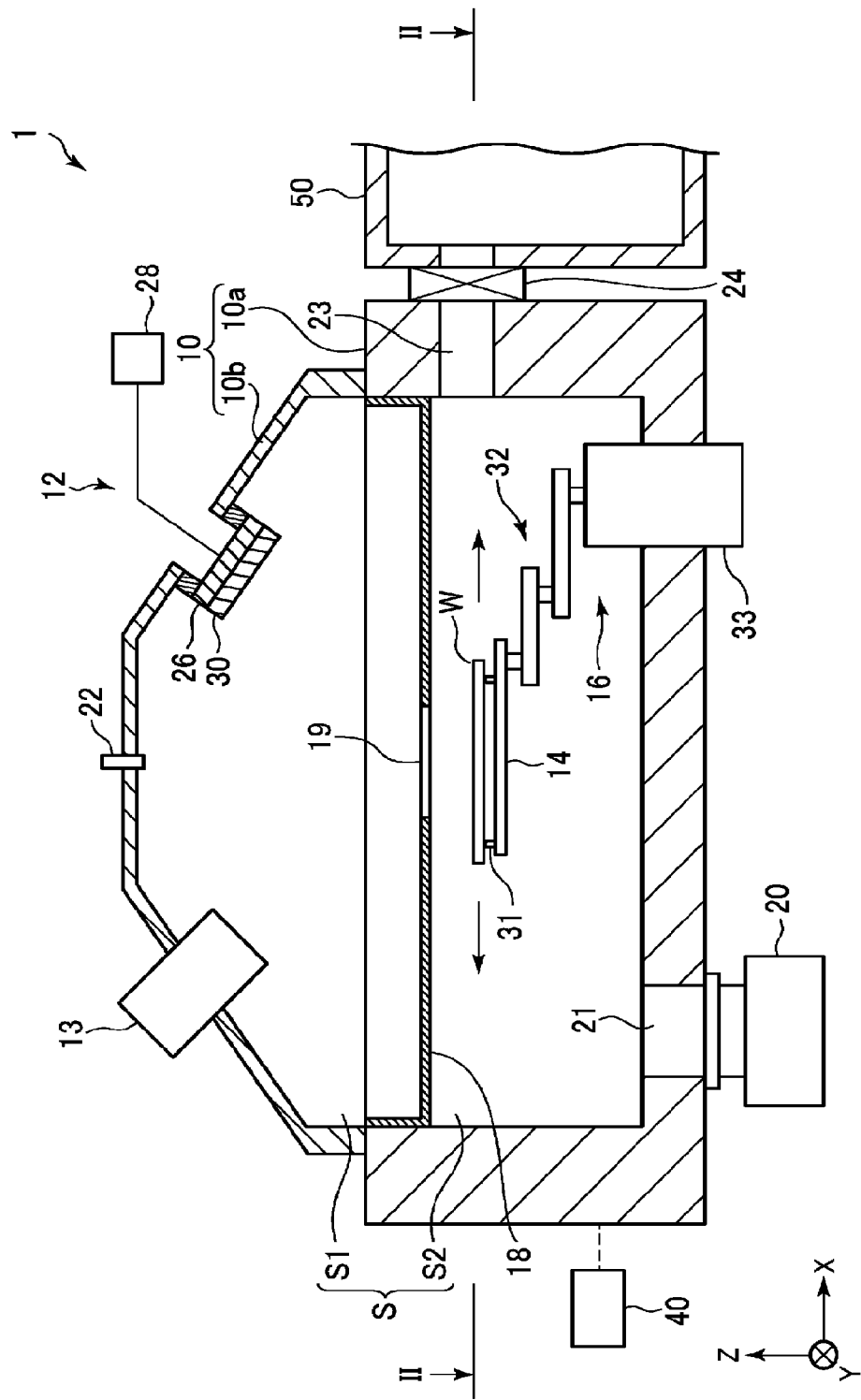
FIG. 1 is a vertical sectional view showing an example of a film forming apparatus according to a first embodiment.
Figure 2:
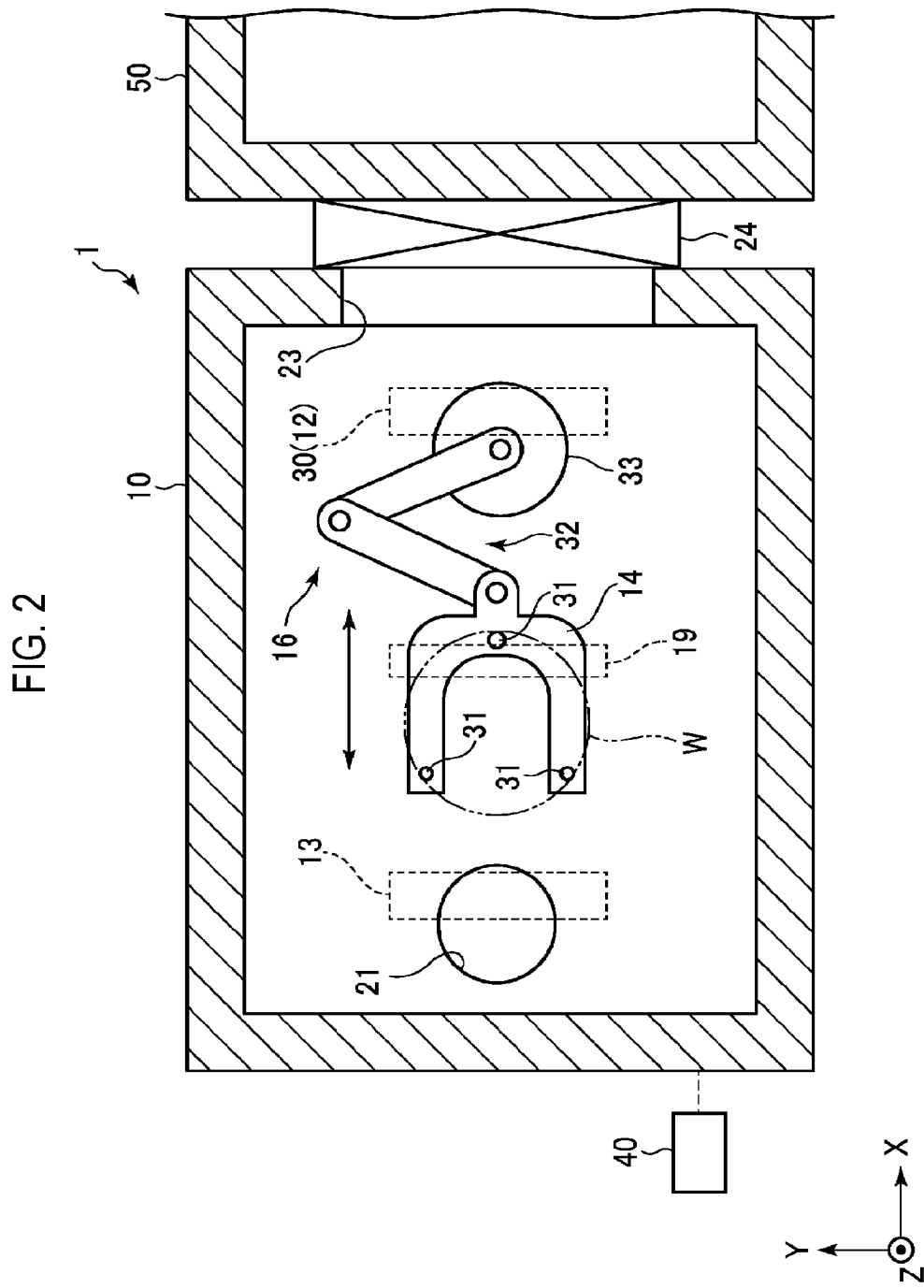
FIG. 2 is a horizontal sectional view taken along line II-II in FIG. 1.

FIG. 1 is a vertical sectional view showing an example of a film forming apparatus according to the first embodiment. FIG. 2 is a horizontal sectional view taken along line II-II in FIG. 1.

A film forming apparatus 1 of the present embodiment is provided to form a film on a substrate W by sputtering. The film forming apparatus 1 includes a processing chamber 10, a sputtering particle emission part 12, an etching particle emission part 13, a substrate support part 14, a substrate moving mechanism 16, a shielding plate 18, and an exhaust device 20. An example of the substrate W may include a semiconductor wafer, but is not limited thereto.

The processing chamber 10 includes a chamber body 10a whose upper portion is opened, and a lid 10b provided so as to close the upper opening of the chamber body 10a. The lid 10b has a top surface and a side surface. The side surface is an inclined surface. The inside of the processing chamber 10 defines a processing space S in which a film forming process is performed.

An exhaust port 21 is formed in the bottom of the processing chamber 10. The exhaust device 20 is connected to the exhaust port 21. The exhaust device 20 includes a pressure control valve and a vacuum pump. The exhaust device 20 is configured to evacuate the processing space S to a predetermined degree of vacuum.

A gas introduction port 22 through which a gas is introduced into the processing space S is inserted into the top surface of the lid 10b. A sputtering gas from a gas supply part (not shown) may be an inert gas and is introduced into the processing space S from the gas introduction port 22.

A loading/unloading port 23 through which the substrate W is transferred is formed in the sidewall of the processing chamber 10. The loading/unloading port 23 is opened and closed by a gate valve 24. The processing chamber 10 is provided adjacent to a transfer chamber 50. The processing chamber 10 and the transfer chamber 50 are brought into communication with each other by opening the gate valve 24. The inside of the transfer chamber 50 is maintained at a predetermined degree of vacuum. A transfer device (not shown) for loading and unloading the substrate W into and from the processing chamber 10 is provided inside the transfer chamber 50.

The shielding plate 18 is provided to shield sputtering particles and etching particles. The shielding plate 18 is configured as a substantially plate-like member and is horizontally disposed at an intermediate position in the height direction of the processing space S. An edge portion of the shield plate 18 is fixed to the sidewall of the chamber body 10a. The shielding plate 18 divides the processing space S into a first space S1 and a second space S2. The first space S1 is a space defined above the shielding plate 18, and the second space S2 is a space defined below the shielding plate 18.

The shielding plate 18 has a slit-like passage hole 19 through which the sputtering particles and the etching particles pass. The passage hole 19 penetrates the shielding plate 18 in the thickness direction (Z direction). The passage hole 19 is formed to be elongated in the Y direction as the longitudinal direction which is one horizontal direction in FIG. 1. The length in the Y direction of the passage hole 19 is formed to be longer than the diameter of the substrate W.

The sputtering particle emission part 12 includes a target holder 26, a target 30 held by the target holder 26, and a power source 28 for applying a voltage to the target holder 26.

The target holder 26 is made of a conductive material. The target holder 26 is disposed above the shielding plate 18 and is attached to the inclined surface of the lid 10b of the processing chamber 10 via an insulating member. The target holder 26 holds the target 30 so that the target 30 is positioned obliquely above the passage hole 19. The target 30 is made of a material containing a constituent element of a film to be formed and may be a conductive material or a dielectric material.

The power source 28 is electrically connected to the target holder 26. The power source 28 may be a DC power source when the target 30 is a conductive material, or may be a high frequency power source when the target 30 is a dielectric material. When the power source 28 is a high frequency power source, the power source 28 is connected to the target holder 26 via a matcher. By applying a voltage to the target holder 26, a sputtering gas is dissociated around the target 30. Then, ions in the dissociated sputtering gas collide with the target 30, and sputtering particles, which are particles of the constituent material of the target 30, are emitted from the target 30.

Among the sputtering particles emitted in an oblique direction from the target 30 held by the sputtering particle emission part 12, the sputtering particles having passed through the passage hole 19 are obliquely incident on the substrate W and are deposited on the substrate W.

The etching particle emission part 13 is provided to emit etching particles having an etching action. Examples of the etching particles emitted from the etching particle emission part 13 may include ions and gas clusters, which are preferably emitted in a highly directional state like an ion beam or a gas cluster beam. When the etching particles are emitted as an ion beam, the etching particle emission part 13 accelerates and emits ions generated by an ion source. When the etching particles are emitted as a gas cluster beam, a cluster generation gas such as $CO_2$ or the like is injected at a high pressure from a nozzle, and a gas cluster is emitted by adiabatic expansion. That is to say, the etching particle emission part 13 is configured in the same manner as a general ion beam radiation device or gas cluster beam radiation device so as to emit ions or gas clusters as etching particles. The gas clusters are formed by aggregating about $10^7$ atoms or molecules of a gas by van der Waals' force. The gas clusters may be ionized or neutral.

The etching particles are obliquely emitted from the etching particle emission part 13. Among the emitted etching particles, the etching particles having passed through the passage hole 19 are obliquely incident on the substrate W to make an etching action with respect to the film formed on the substrate W, whereby a portion of the film is removed.

In addition, the etching particle emission part 13 may be configured so that the emission direction of the etching particles can be adjusted. The etching particle emission part 13 may be movable by itself. Thus, the etching particles can be irradiated onto a desired position on the substrate W to perform etching.

The sputtering particle emission part 12 and the etching particle emission part 13 are provided opposite to each other when viewed from the passage hole 19. By doing so, the sputtering particles can be emitted from one side of the substrate W to perform directional film formation, and the etching particles can be emitted from the opposite side of the substrate W to etch away excess film portions.

The substrate support part 14 is provided inside the chamber body 10a of the processing chamber 10 and is configured to horizontally support the substrate W through support pins 31. The substrate support part 14 can be linearly moved (reciprocated) along the X direction as one horizontal direction by the substrate moving mechanism 16. Therefore, the substrate W supported by the substrate support part 14 is linearly moved in the horizontal plane by the substrate moving mechanism 16. The substrate moving mechanism 16 includes an articulated arm part 32 and a drive part 33. By driving the articulated arm part 32 with the drive part 33, the substrate support part 14 can be moved in the X direction.

The film forming apparatus 1 further includes a controller 40. The controller 40 is formed of a computer and is configured to control the respective components of the film forming apparatus 1, for example, the power source 28 of the sputtering particle emission part 12, the etching particle emission part 13, the exhaust device 20, the drive part 33, and the like. The controller 40 includes a main controller composed of a CPU that actually performs the control of the components, an input device, an output device, a display device, and a memory device. The memory device stores parameters of various processes to be executed by the film forming apparatus 1. Furthermore, a storage medium that stores a program for controlling the processes to be executed by the film forming apparatus 1, namely a process recipe, can be set in the memory device. The main controller of the controller 40 calls a predetermined process recipe stored in the storage medium and causes the film forming apparatus 1 to execute a predetermined process based on the process recipe.

Next, a film forming method implemented by the film forming apparatus configured as above will be described.

First, after evacuating the processing space S in the processing chamber 10, a sputtering gas which may be an inert gas, is introduced into the processing space S from the gas introduction port 22 to adjust an internal pressure of the processing space S to a predetermined pressure.

Subsequently, the substrate support part 14 is positioned at a substrate delivery position, the gate valve 24 is opened, and the substrate W is mounted on the substrate support part 14 (on the support pins 31) by the transfer device (not shown) of the transfer chamber 50. Thereafter, the transfer device is returned to the transfer chamber 50, and the gate valve 24 is closed.

Subsequently, sputtering particles are emitted obliquely from the target 30 of the sputtering particle emission part 12 while moving the substrate W on the substrate support part 14 in the X direction as one horizontal direction.

At this time, the sputtering particles are emitted by applying a voltage from the power source 28 to the target holder 26 so that the ions in the sputtering gas dissociated around the target 30 collide with the target 30.

The sputtering particles emitted obliquely from the target 30 of the sputtering particle emission part 12 are obliquely incident on the substrate W through the passage hole 19 formed in the shielding plate 18 and are deposited on the substrate W, whereby a predetermined film is formed by the oblique film formation.

Furthermore, while moving the substrate W on the substrate support part 14 in the X direction as one horizontal direction, etching particles such as ion beams or gas cluster beams are emitted obliquely from the etching particle emission part 13.

The etching particles emitted obliquely from the etching particle emission part 13 are obliquely incident on the substrate W through the passage hole 19 formed in the shielding plate 18, which makes it possible to etch away a portion, typically excess portions, of the film deposited on the substrate W.

The emission of the sputtering particles from the sputtering particle emission part 12 and the emission of the etching particles from the etching particle emission part 13 may be simultaneously performed. Alternatively, the etching particles may be emitted after the emission of the sputtering particles.

Figure 3:
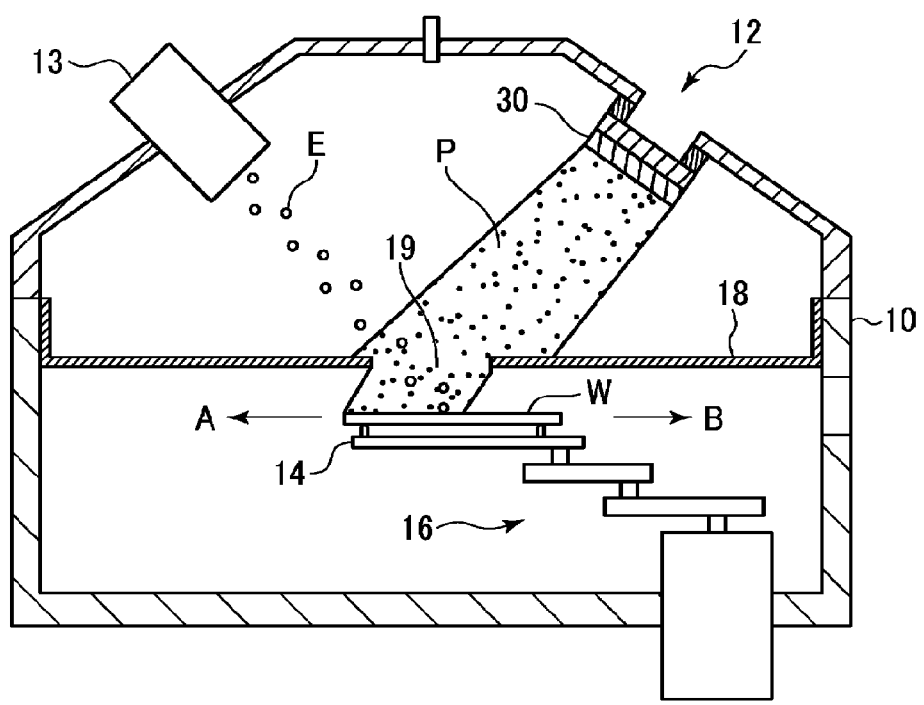
FIG. 3 is a schematic view for explaining an implementation state in a case of simultaneously performing the emission of sputtering particles and the emission of etching particles in the film forming apparatus of FIG. 1.

In the case of the simultaneous emission as shown in FIG. 3, the sputtering particles P may be emitted from the sputtering particle emission part 12 and the etching particles E may be emitted from the etching particle emission part 13, while moving the substrate W in the direction A or the opposite direction B along the X direction in FIG. 3. As a result, while performing film formation by depositing the sputtering particles, the excess portions of the film are etched by the etching particles E.

In the case of the one-by-one emission, the sputtering particles are first emitted from the sputtering particle emission part 12 to form a film. Thereafter, the emission of the sputtering particles is stopped, and the etching particles are emitted from the etching particle emission part 13 to etch the excess portions of the film thus formed.

Specifically, the procedure is performed as shown in FIGS. 4A to 4D.

Figure 4A:
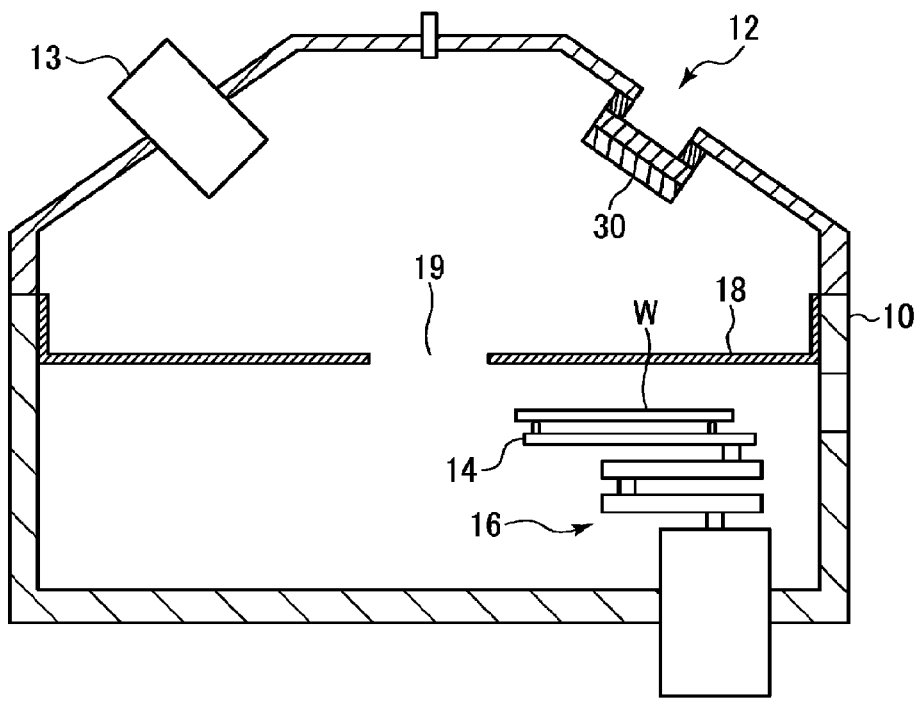
FIG. 4A is a schematic view for explaining an implementation state in a case of performing the emission of sputtering particles and the emission of etching particles one by one in the film forming apparatus of FIG. 1.
Figure 4B:
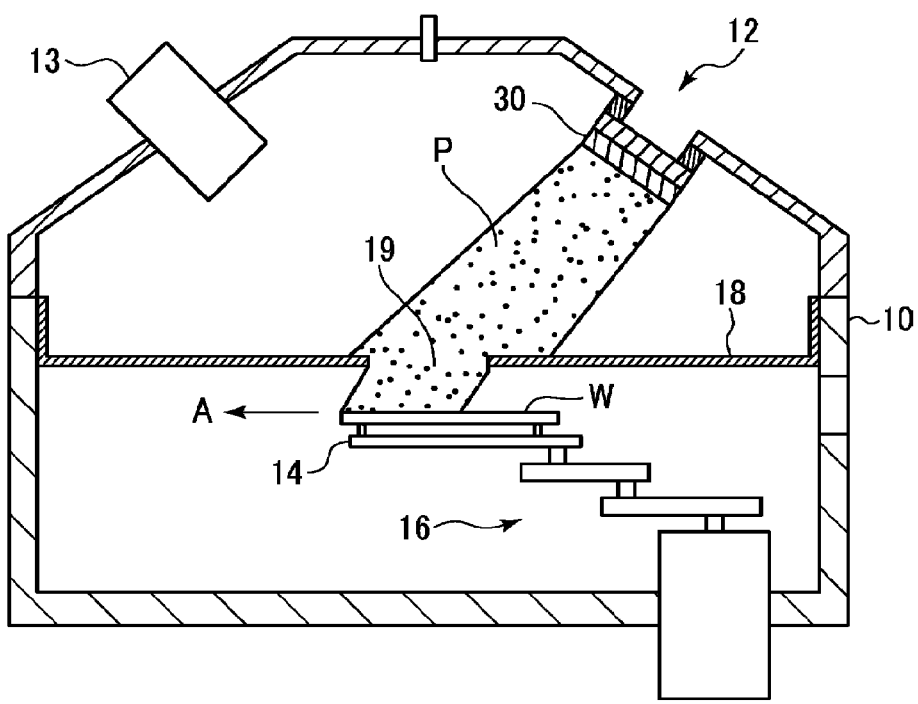
FIG. 4B is a schematic view for explaining an implementation state in the case of performing the emission of sputtering particles and the emission of etching particles one by one in the film forming apparatus of FIG. 1.

First, as shown in FIG. 4A, the substrate W is delivered to the substrate support part 14 staying in a retracted position. Subsequently, as shown in FIG. 4B, the sputtering particles P are emitted obliquely from the target 30 of the sputtering particle emission part 12 while moving the substrate W on the substrate support part 14 in the A direction along the X direction in FIG. 4B. As a result, the sputtering particles P are obliquely incident on the substrate W from one direction and are deposited on the substrate W, whereby a predetermined film is formed by such an oblique film formation.

Figure 4C:
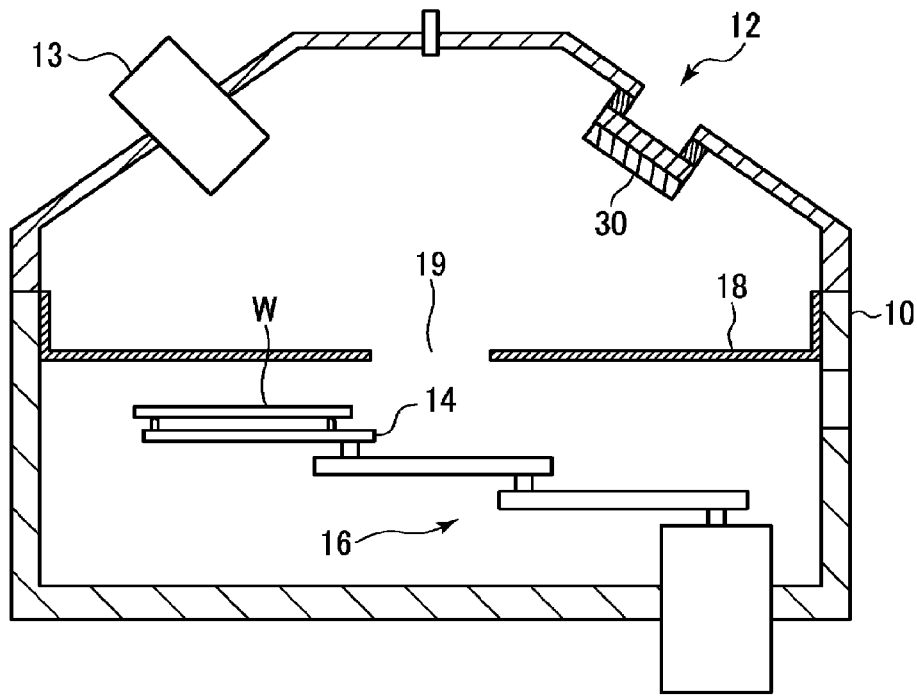
FIG. 4C is a schematic view for explaining an implementation state in the case of performing the emission of sputtering particles and the emission of etching particles one by one in the film forming apparatus of FIG. 1.

As shown in FIG. 4C, after the entire substrate W has passed through the passage hole 19 of the shielding plate 18, the sputtering particle emission part 12 stops the emission of the sputtering particles from the target 30.

Figure 4D:
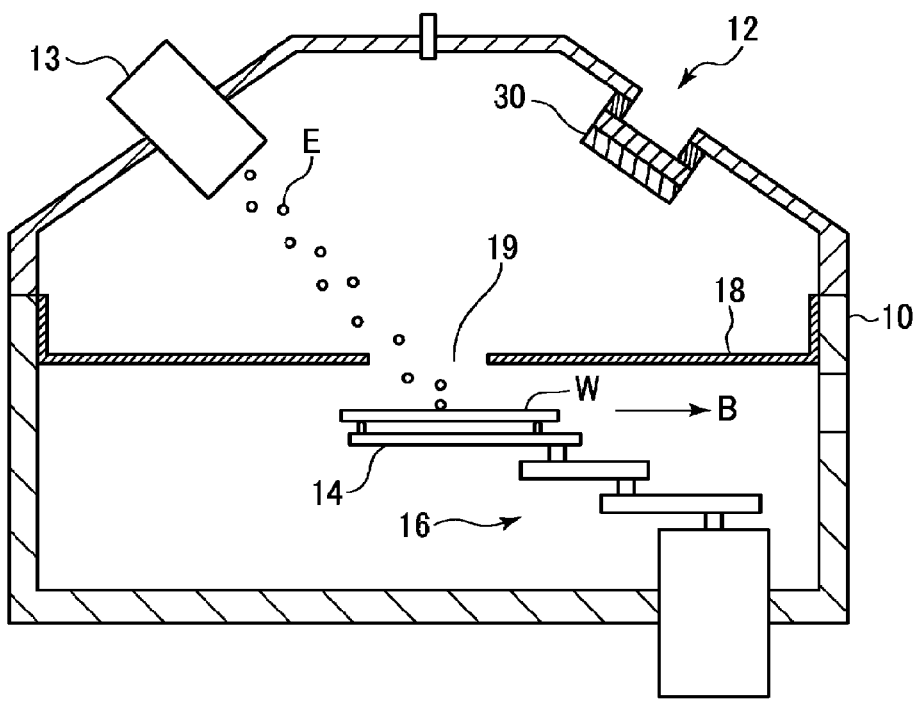
FIG. 4D is a schematic view for explaining an implementation state in the case of performing the emission of sputtering particles and the emission of etching particles one by one in the film forming apparatus of FIG. 1.

Subsequently, as shown in FIG. 4D, the etching particles E are emitted obliquely from the etching particle emission part 13 while moving the substrate W on the substrate support part 14 in the B direction opposite to the A direction. As a result, the etching particles are obliquely incident on the substrate W from the direction opposite to the previous one direction, whereby the excess portions of the formed film are etched.

In some embodiments, the above-described film formation and the above-described etching may be performed at least twice.

Conventionally, as disclosed in Patent Document 2, a film formation with high directivity is realized by performing film formation by causing sputtering particles to be obliquely emitted from a target of one sputtering particle emission part while scanning a substrate. However, the film is sometimes formed on excess portions. In such a case, in order to correct the shape of the film-formed portion to a desired shape, it is necessary to perform an etching process with an additional apparatus, which may complicate the apparatus and process.

On the other hand, in the present embodiment, the sputtering particles can be obliquely emitted from the sputtering particle emission part 12 in one processing chamber 10 to form a film on the substrate, and the etching particles can be emitted from the etching particle emission part 13 to perform shape correction. Therefore, it is possible to easily form a film having a desired shape. Furthermore, since the etching is performed by etching particles such as an ion beam or the like, it is possible to arbitrarily set the location and size of the removed portion.

Figure 5A:
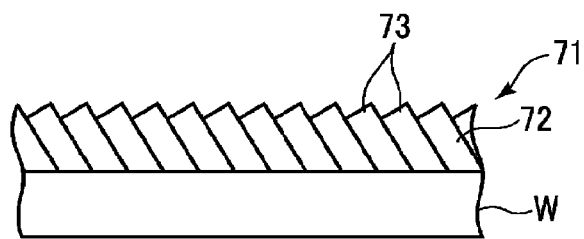
FIG. 5A is a view showing a state of a film when the film is formed on a substrate by oblique film formation.
Figure 5B:
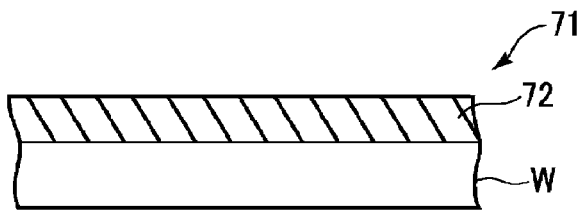
FIG. 5B is a view showing a state after processing is performed by etching particles after oblique film formation.

For example, when the oblique film formation is performed, as shown in FIG. 5A, crystals 72 grow on the substrate W in a direction corresponding to the incidence direction of the sputtering particles, and a film 71 with high directivity is formed. At this time, excess protrusions 73 may be formed in the surface of the film 71. In this state, the etching particles are emitted from the etching particle emission part 13 toward the protrusions 73, whereby a desired flat surface from which the protrusions 73 are removed is formed as shown in FIG. 5B.

In the present embodiment, the arrangement position and orientation of the sputtering particle emission part 12 (the target 30), and the arrangement position and orientation of the etching particle emission part 13 are arbitrary and may be set according to the pattern formed on the substrate W.

Figure 6:
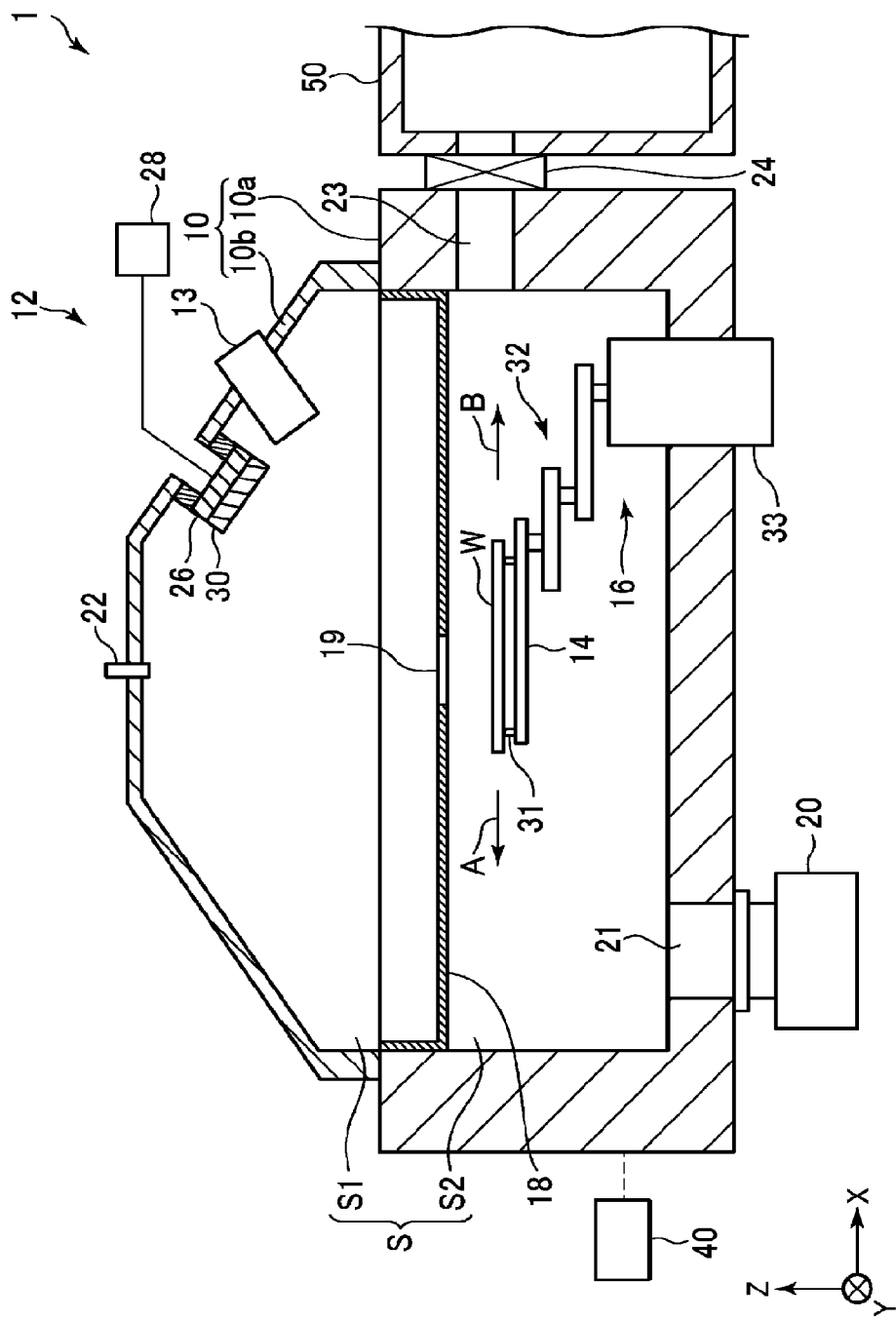
FIG. 6 is a vertical sectional view showing another example of the film forming apparatus according to the first embodiment.

For example, as shown in FIG. 6, the etching particle emission part 13 may be provided on the same side as the sputtering particle emission part 12 so that excess portions of the substrate W at the side on which the sputtering particles are incident can be etched.

Figure 7:
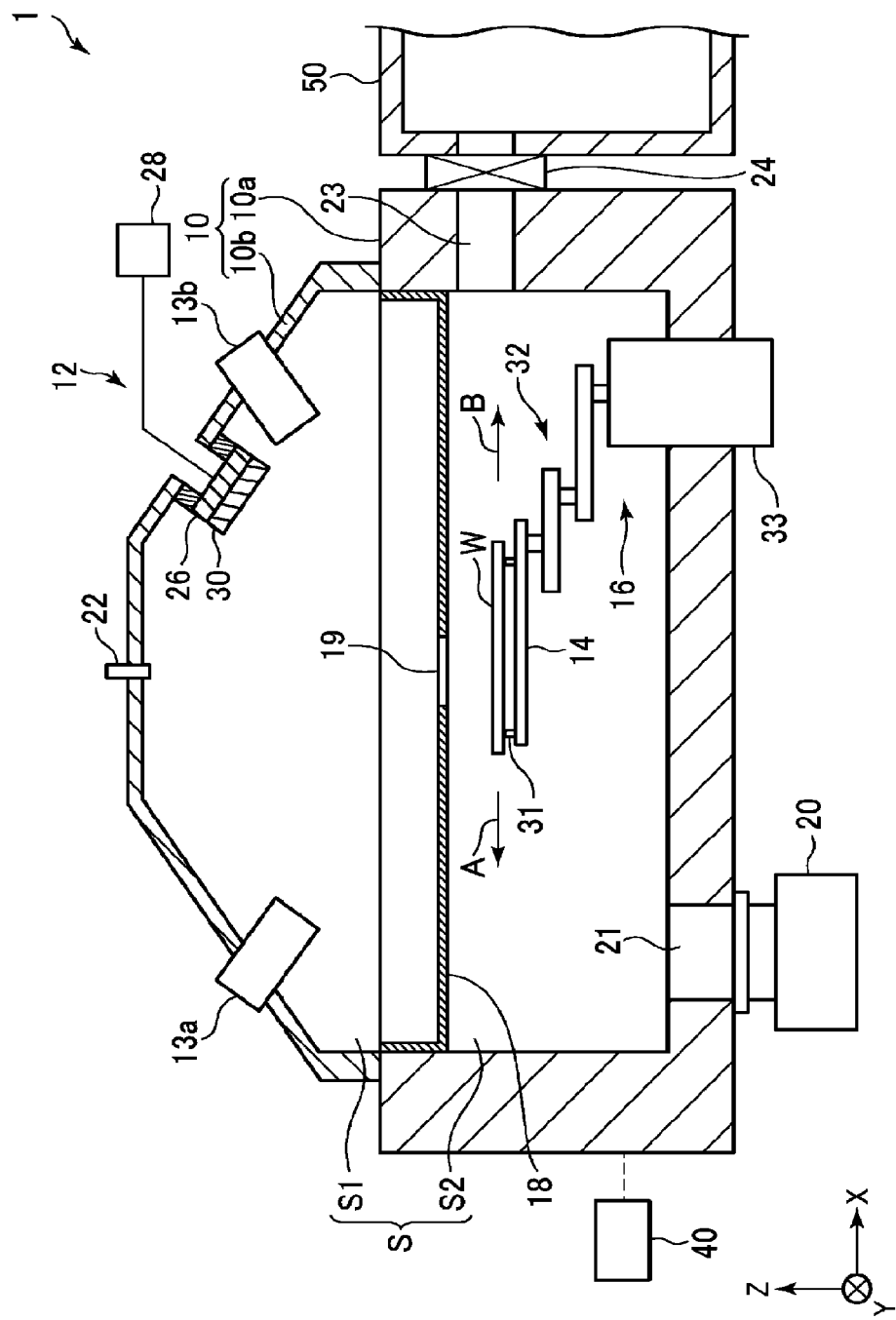
FIG. 7 is a vertical sectional view showing still another example of the film forming apparatus according to the first embodiment.

Furthermore, for example, as shown in FIG. 7, two etching particle emission parts 13a and 13b configured similarly to the etching particle emission part 13 may be provided in the inclined surface of the lid 10b at the same side as the sputtering particle emission part 12 and at the opposite side from the sputtering particle emission part 12 so as to face each other. As a result, the excess portions of the film may be etched at the sputtering particle incidence side of the substrate W and on the opposite side thereof.

In some embodiments, the etching particle emission part may be disposed at a position where the etching particles are emitted in a direction orthogonal to the sputtering particle emission direction in a plan view.

Figure 8:
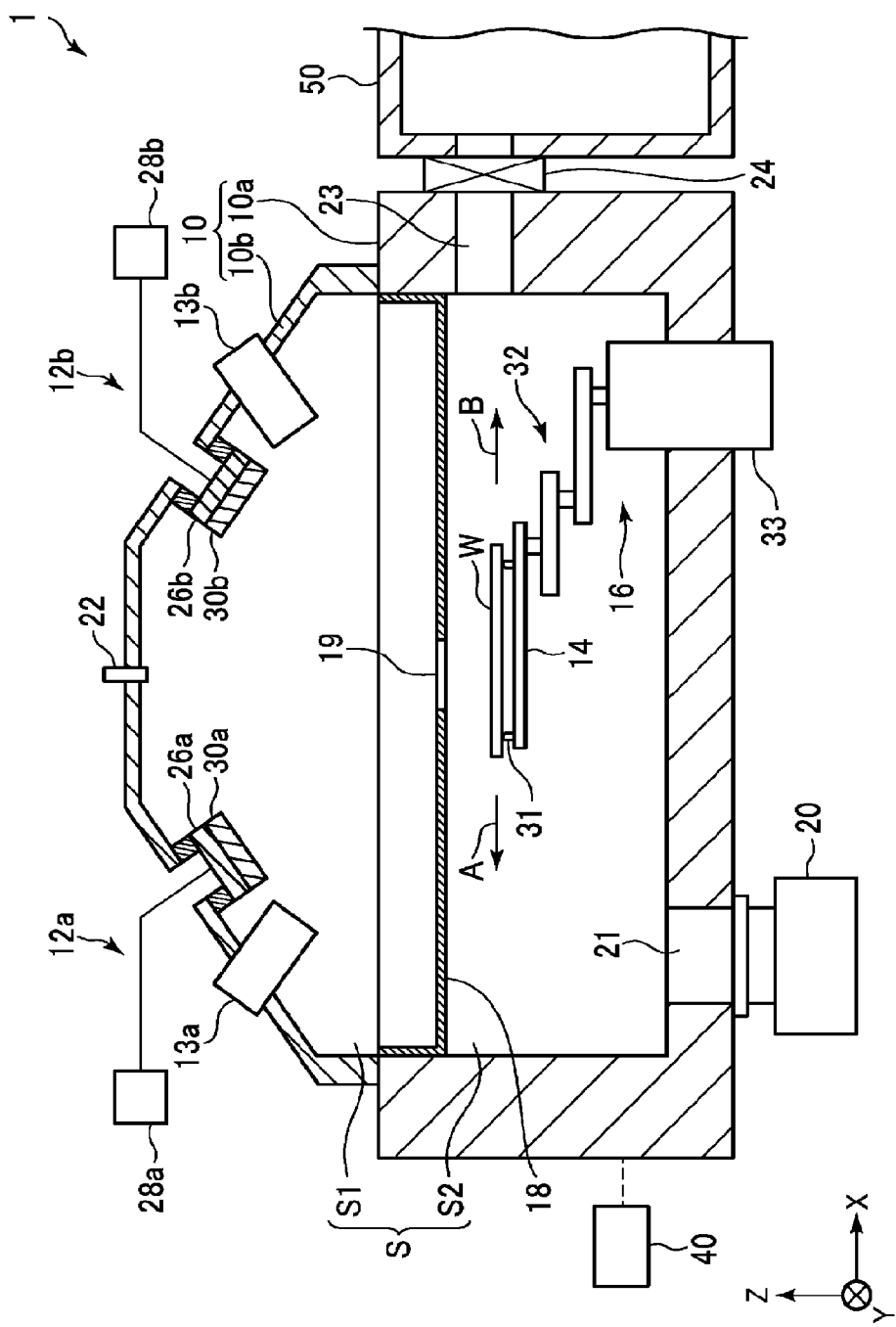
FIG. 8 is a vertical sectional view showing still another example of the film forming apparatus according to the first embodiment.

In some embodiments, for example, as shown in FIG. 8, two sputtering particle emission parts 12a and 12b and two etching particle emission parts 13a and 13b may be provided. The two sputtering particle emission parts 12a and 12b may be provided to face each other across the passage hole 19. In the case of this example, the two etching particle emission parts 13a and 13b are provided at positions corresponding to the two sputtering particle emission parts 12a and 12b, respectively, so as to face each other across the passage hole 19.

The sputtering particle emission part 12a includes a target holder 26a, a target 30a held by the target holder 26a, and a power source 28a for applying a voltage to the target holder 26a. Furthermore, the sputtering particle emission part 12b also includes a target holder 26b, a target 30b held by the target holder 26b, and a power source 28b for supplying a voltage to the target holder 26b.

Figure 9A:
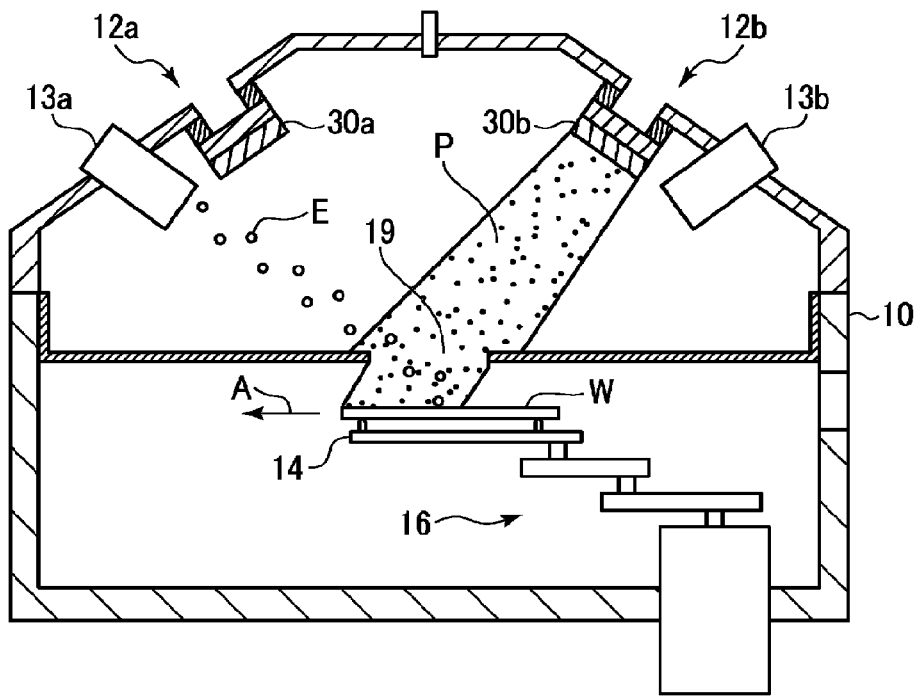
FIG. 9A is a view for explaining an implementation state of the film forming apparatus of FIG. 8.

In the apparatus of exemplary embodiment, first, as shown in FIG. 9A, while moving the substrate W in the A direction, sputtering particles are emitted from the sputtering particle emission part 12b, and etching particles are emitted from the etching particle emission part 13a at the opposite side. As a result, the sputtering particles P are obliquely incident on the substrate W from one direction and deposited on the substrate W, and the etching particles E are obliquely incident on the substrate W from the opposite direction to etch excess portions (in a first process).

Figure 9B:
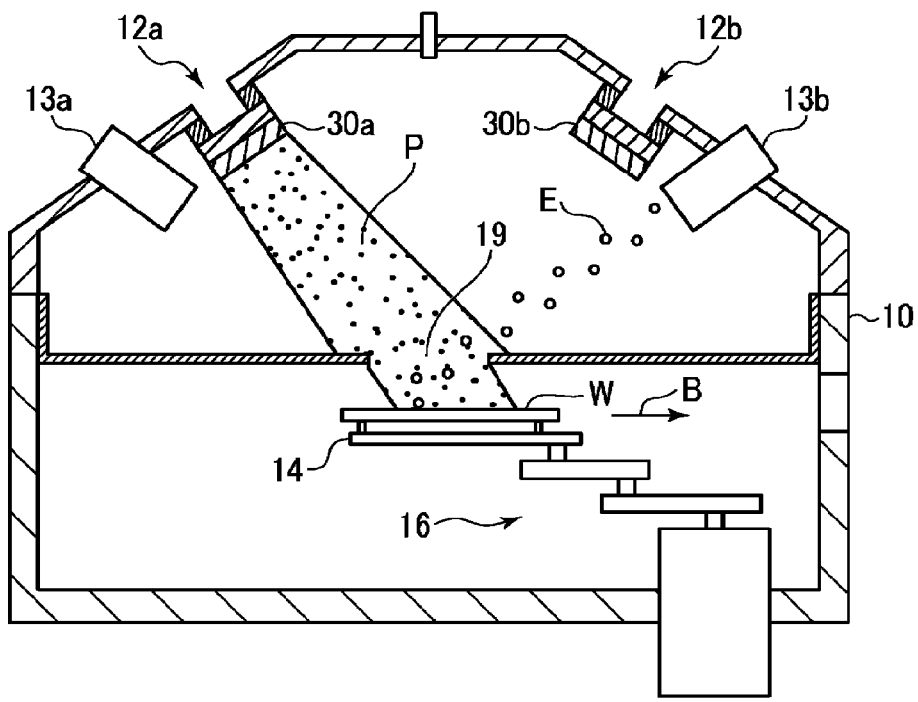
FIG. 9B is a view for explaining an implementation state of the film forming apparatus of FIG. 8.

Subsequently, as shown in FIG. 9B, while moving the substrate W in the B direction, sputtering particles are emitted from the sputtering particle emission part 12a, and etching particles are emitted from the etching particle emission part 13b at the opposite side. Thus, the sputtering particles P are obliquely incident on the substrate W from the direction opposite to the previous one direction, and the etching particles E are obliquely incident on the substrate W from the previous one direction, whereby the excess portions are etched (in a second process).

As described above, in the first process and the second process, a film having a desired shape from which the excess portions have been removed is formed. Therefore, stacking film formation can be performed by alternately repeating the first process and the second process one or more times. Thus, a film having a desired thickness can be formed in a short period of time.

In some embodiments, in the film forming apparatus shown in FIG. 8, the film formation based on the sputtering particles and the etching based on the etching particles may be alternately performed. In that case, as a first process, the sputtering particles are emitted from the sputtering particle emission part 12b while moving the substrate W in the A direction, and then the etching particles are emitted from the etching particle emission part 13a while moving the substrate W in the B direction. Furthermore, as a second process, the sputtering particles are emitted from the sputtering particle emission part 12a while moving the substrate W in the B direction, and then the etching particles are emitted from the etching particle emission part 13b while moving the substrate W in the A direction. Stacking film formation can be performed by repeating the first process and the second process.

Second Embodiment

Next, a second embodiment will be described.

Figure 10:
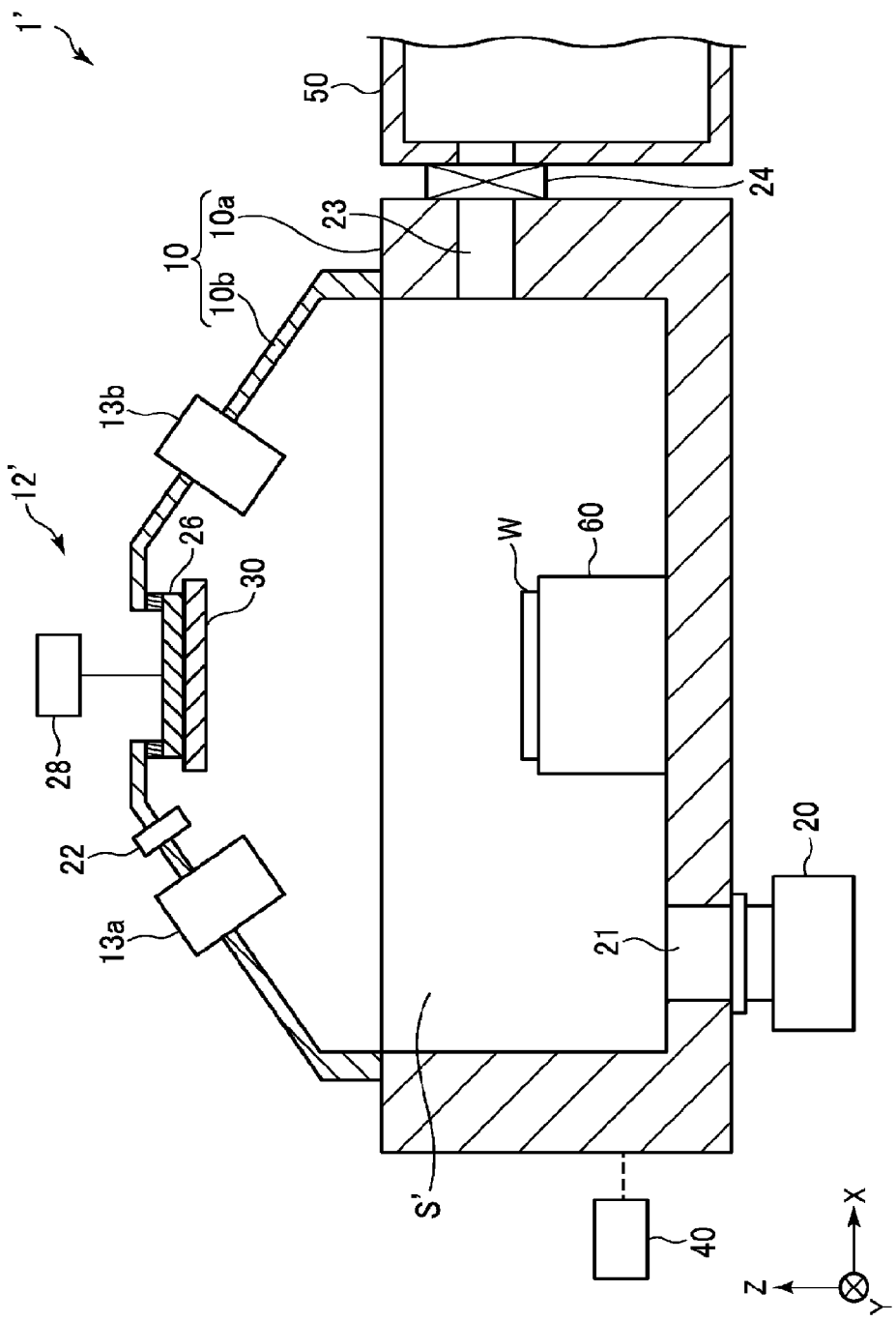
FIG. 10 is a vertical sectional view showing an example of a film forming apparatus according to a second embodiment.

FIG. 10 is a vertical sectional view showing a film forming apparatus according to the second embodiment.

A film forming apparatus 1' of the present embodiment is different from the film forming apparatus 1 of the first embodiment in which the oblique film formation is performed, and is configured to perform an ordinary sputtering-based film formation. For this reason, the target is provided so as to face the substrate W. There is no shielding plate having a passage hole, and there is no moving mechanism for linearly moving the substrate W.

Similar to the film forming apparatus 1 according to the first embodiment, the film forming apparatus 1' includes a processing chamber 10 including a chamber body 10a having an upper opening and a lid 10b provided to close the upper opening of the chamber body 10a. The lid 10b has a top surface and a side surface. The side surface is an inclined surface.

The inside of the processing chamber 10 defines a processing space S' in which a film forming process is performed. A stage (substrate support part) 60 for mounting a substrate W thereon is provided at the center of the bottom of the processing chamber 10. Furthermore, similar to the film forming apparatus 1, an exhaust port 21 is formed in the bottom of the processing chamber 10, and an exhaust device 20 is connected to the exhaust port 21.

Furthermore, a gas introduction port 22 through which a sputtering gas is introduced into Cthe processing space S' is inserted in the vicinity of the top surface of the lid 10b.

A loading/unloading port 23 through which the substrate W is transferred is formed in the sidewall of the processing chamber 10. The loading/unloading port 23 is opened and closed by a gate valve 24.

In the top surface of the lid 10b of the processing chamber 10, a sputtering particle emission part 12' for emitting sputtering particles is provided so as to face the stage 60. Similar to the sputtering particle emission part 12 described above, the sputtering particle emission part 12' includes a target holder 26, a target 30 held by the target holder 26, and a power source 28 for applying a voltage to the target holder 26.

As in FIG. 7, two etching particle emission parts 13a and 13b are provided in the side surface of the lid 10b so as to face each other. However, the number and arrangement position of the etching particle emission parts are arbitrary. In some embodiments, the etching particle emission parts may adjust the emission direction of the etching particles. The etching particle emission parts may be movable by themselves. Therefore, etching particles can be irradiated to a desired position of the substrate W to perform etching.

Next, a film forming method implemented by the film forming apparatus of the second embodiment configured as above will be described.

First, after evacuating the processing space S' in the processing chamber 10, a sputtering gas such as an inert gas, is introduced into the processing space S' from the gas introduction port 22 to adjust an internal pressure of the processing space S' to a predetermined pressure.

Subsequently, the gate valve 24 is opened, and the substrate W is mounted on the stage 60 by a transfer device (not shown) of a transfer chamber 50. The transfer device is then returned to the transfer chamber 50, and the gate valve 24 is closed.

Subsequently, sputtering particles are emitted downward from the target 30 of the sputtering particle emission part 12'. At this time, the sputtering particles are emitted by applying a voltage from the power source 28 to the target holder 26 so that the ions in the sputtering gas dissociated around the target 30 collide with the target 30. The emitted sputtering particles are deposited on the substrate W to form a predetermined film.

In addition, etching particles, for example, an ion beam, a gas cluster beam or the like are emitted obliquely from the etching particle emission parts 13a and 13b. The etching particles emitted obliquely from the etching particle emission part 13a and 13b are obliquely incident on the substrate W, whereby the excess portions of the film deposited on the substrate W are etched.

The emission of the sputtering particles from the sputtering particle emission part 12' and the emission of the etching particles from the etching particle emission parts 13a and 13b may be simultaneously performed. Alternatively, the etching particles may be emitted after the emission of the sputtering particles.

As described above, even in the present embodiment, the sputtering-based film formation and the shape correction by the etching removal of the excess film portions formed by the sputtering-based film formation can be performed in one processing chamber 10. It is therefore possible to easily perform formation of a film having desired shape.

In some embodiments, a mechanism for rotating the stage 60 may be provided, and the substrate W may be rotated by rotating the stage 60 when performing the sputtering-based film formation or the shape correction by etching removal. By rotating the substrate W, it becomes possible to form a film covering the entire trench pattern in the sputtering-based film formation and to correct or optimize a film formation amount of the film adhering to the trench pattern by the etching removal.

Figure 11A:
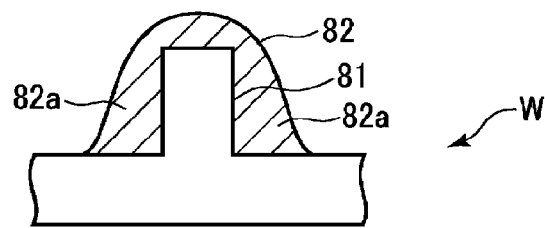
FIG. 11A is a sectional view showing a state of a formed film when sputtering-based film formation is performed on a substrate having a trench pattern formed thereon, using the film forming apparatus of FIG. 10.
Figure 11B:
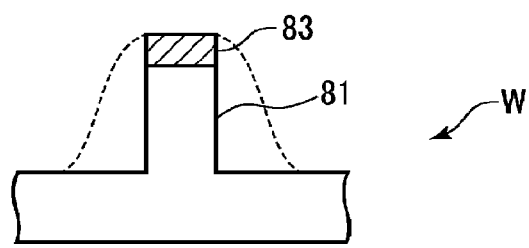
FIG. 11B is a sectional view showing a state in which the side portion of the film is removed by etching particles from the state of FIG. 11A.
Figure 11C:
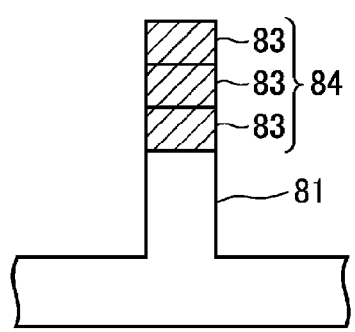
FIG. 11C is a sectional view showing a state of a laminated film formed by repeating the sputtering-based film formation and etching with etching particles in the film forming apparatus of FIG. 10.

Furthermore, when it is necessary to form a film having a relatively large height on the protrusion of the trench pattern, there is a need to remove the excess portions as much as possible. For example, when the ordinary sputtering-based film formation is performed on the substrate W on which the trench pattern is formed, as shown in FIG. 11A, a film 82 formed on a protrusion 81 is formed not only on the upper surface of the protrusion 81 but also on the side surface of the protrusion 81. In this case, a side surface portion 82a of the film 82 hinders film formation in the height direction. However, by performing etching with the etching particles emitted from the etching particle emission parts 13a and 13b after sputtering, as shown in FIG. 11B, it is possible to remove the side surface portion 82a and to leave only the film 83 on the top surface of the protrusion 81. Therefore, by repeating the sputtering-based film formation and the etching a plurality of times, as shown in FIG. 11C, the stacking film formation can be performed only on the top surface of the protrusion 81, and a film 84 having a desired height can be formed.

Figure 12:
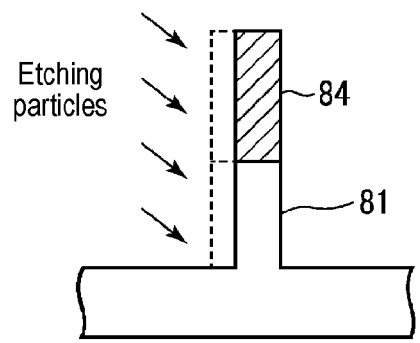
FIG. 12 is a sectional view showing a state available when a thin film is formed by further etching the side surface with etching particles from the state of FIG. 11C.

Furthermore, after forming the film 84 having a desired height in this manner, the etching particles may be emitted from at least one of the etching particle emission part 13a and the etching particle emission part 13b to additionally perform etching, whereby as shown in FIG. 12, the film 84 can be made thinner. For example, if the film 84 is a wiring, it is possible to form a thinner wiring. That is to say, the thinning of a wiring can be realized in one processing chamber without performing pattern etching.

Figure 13A:
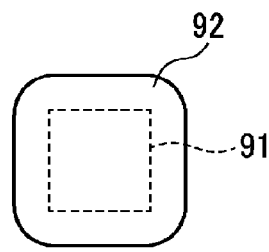
FIG. 13A is a plan view showing a state in which a film is formed on a protrusion pattern.
Figure 13B:
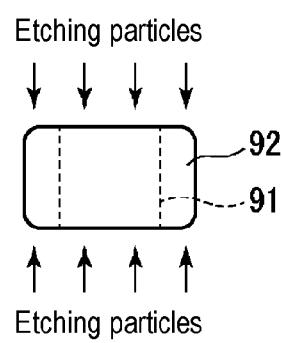
FIG. 13B is a plan view showing a state in which film portions on mutually opposing side surfaces are removed by etching from the state of FIG. 13A.

Furthermore, in the case of three-dimensional film formation, after the sputtering-based film formation, only the film portion on at least one of the side surfaces of the protrusion may be etched away by the etching particles emitted from at least one of the etching particle emission part 13a and the etching particle emission part 13b. Thus, only the film portion on the specific side which needs to be removed can be etched away. For example, as shown in the plan view of FIG. 13A, after forming a film 92 on a protrusion 91, as shown in FIG. 13B, film portions on mutually facing sides can be etched away, and film portions on other sides can be left.

This holds true in the first embodiment.

Other Application

Although embodiments have been described above, it should be noted that the embodiments disclosed herein are exemplary in all respects and are not restrictive. The above-described embodiments may be omitted, replaced or modified in various forms without departing from the scope and spirit of the appended claims.

For example, the method of emitting the sputtering particles in the above embodiments is nothing more than an example and the sputtering particles may be emitted by other methods. Furthermore, the method of emitting the etching particles are also nothing more than an example. The etching particles may be any particle as long as they exert an etching action, and the method of emitting the etching particles is not particularly limited.

Furthermore, although the articulated arm mechanism is used as the substrate moving mechanism in the first embodiment, the present disclosure is not limited thereto. The substrate moving mechanism may be any mechanism that can move a substrate linearly, such as a belt conveyor or the like. When the belt conveyor is used, the belt conveyor serves both as a substrate support part and a substrate moving mechanism.

According to the present disclosure in some embodiments, it is possible to provide a film forming apparatus and film forming method capable of easily forming a film having a desired shape.

What is claimed is:

1. A film forming method of forming a predetermined film by a film forming apparatus, wherein the film forming apparatus comprises:
   a processing chamber having a processing space in which a film forming process is performed on a substrate;
   a substrate support part configured to support the substrate inside the processing chamber;
   at least one sputtering particle emission part including a target and configured to emit sputtering particles to the substrate from the target;
   at least one etching particle emission part configured to emit etching particles having an etching action with respect to the substrate;
   a shielding plate provided between the substrate support part and both of the at least one sputtering particle emission part and the at least one etching particle emission part, and having a passage hole through which the sputtering particles emitted from the at least one sputtering particle emission part and the etching particles emitted from the at least one etching particle emission part pass; and
   a substrate moving mechanism configured to linearly move the substrate supported by the substrate support part,
   wherein the at least one sputtering particle emission part and the at least one etching particle emission part are provided to face each other across the passage hole,
   the method comprising:
   supporting the substrate on the substrate support part;
   emitting the sputtering particles from the at least one sputtering particle emission part in an oblique direction through the passage hole to deposit the sputtering particles on the substrate to form a film when the substrate is linearly moved in a first direction by the substrate moving mechanism; and
   subsequently, emitting the etching particles from the at least one etching particle emission part through the passage hole to etch a portion of the film when the substrate is linearly moved in a second direction opposite to the first direction by the substrate moving mechanism.

2. The method of claim 1, wherein the at least one etching particle emission part is configured to emit ions or gas clusters as the etching particles in the form of an ion beam or a gas cluster beam.

3. The method of claim 1, wherein the emitting the sputtering particles from the at least one sputtering particle emission part and the emitting the etching particles from the at least one etching particle emission part are performed at least twice.

4. The method of claim 3, wherein the substrate has a protrusion, and a stacking film formation is performed on the protrusion by performing, the at least twice, the emitting the sputtering particles from the at least one sputtering particle emission part and the emitting the etching particles from the at least one etching particle emission part.

5. The method of claim 4, further comprising:
   etching a stacked film by emitting the etching particles from the at least one etching particle emission part with respect to the stacked film formed by performing the stacking film formation on the protrusion.

6. The method of claim 1, wherein the substrate has a protrusion, the film is formed on a portion including the protrusion by the emitting the sputtering particles from the at least one sputtering particle emission part, and the portion of the film formed on at least one side surface of the protrusion is removed by the emitting the etching particles from the at least one etching particle emission part.

7. The method of claim 1, wherein the at least one sputtering particle emission part includes two sputtering particle emission parts provided to face each other across the passage hole, the at least one etching particle emission part includes two etching particle emission parts provided at positions corresponding to the two sputtering particle emission parts so as to face each other across the passage hole.

* * * * *